(12) United States Patent
Yamaguchi (10) Patent No.: US 10,830,608 B2
(45) Date of Patent: Nov. 10, 2020

(54) SENSOR MODULE

(71) Applicant: Murata Manufacturing Co., Ltd., Nagaokakyo (JP)

(72) Inventor: Yoshihiro Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 627 days.

(21) Appl. No.: 15/608,088

(22) Filed: May 30, 2017

(65) Prior Publication Data

US 2017/0261337 A1    Sep. 14, 2017

Related U.S. Application Data

(63) Continuation of application No. PCT/JP2015/081279, filed on Nov. 6, 2015.

(30) Foreign Application Priority Data

Dec. 5, 2014  (JP) ................................. 2014-246931

(51) Int. Cl.
*G01D 3/024* (2006.01)
*G01L 1/16* (2006.01)
(Continued)

(52) U.S. Cl.
CPC ............... *G01D 3/024* (2013.01); *G01D 3/02* (2013.01); *G01L 1/16* (2013.01); *G01R 31/44* (2013.01); *G01R 1/30* (2013.01); *G01R 31/28* (2013.01)

(58) Field of Classification Search
None
See application file for complete search history.

(56) References Cited

U.S. PATENT DOCUMENTS 7,082,830 B2    8/2006  Kunda et al.
7,382,150 B2    6/2008  Ohashi et al.
(Continued)

FOREIGN PATENT DOCUMENTS

CN    103731108 A    4/2014
JP    S55-29762 A    3/1980
(Continued)

OTHER PUBLICATIONS

International Search Report issued in International Patent Application No. PCT/JP2015/081279, dated Jan. 19, 2016.
(Continued)

*Primary Examiner* — Tung S Lau
(74) *Attorney, Agent, or Firm* — Arent Fox LLP (57) ABSTRACT

A detection circuit includes a charge amplifier, a calculation unit, and first and second paths. The charge amplifier converts the amount of electric charge generated by a sensor element into a voltage. The first path and the second path each connect the charge amplifier and the calculation unit. The amplification factor of the first path is higher than the amplification factor of the second path. When a voltage output from the first path is lower than a threshold voltage, the calculation unit detects a pressing force by using the output voltage. When the output voltage is equal to or higher than the threshold voltage, the calculation unit detects a pressing force by using a voltage output through the second path.

20 Claims, 5 Drawing Sheets

(51) Int. Cl.
*G01R 31/44* (2020.01)
*G01D 3/02* (2006.01)
*G01R 1/30* (2006.01)
*G01R 31/28* (2006.01)

(56) References Cited

U.S. PATENT DOCUMENTS

| | | |
|---|---|---|
| 7,783,446 B2 | 8/2010 | Amstutz et al. |
| 2004/0177691 A1 | 9/2004 | Kunda et al. |
| 2006/0238253 A1 | 10/2006 | Ohashi et al. |
| 2008/0300812 A1 | 12/2008 | Amstutz et al. |
| 2016/0179276 A1* | 6/2016 | Nathan ................. G06F 3/0416 345/174 |
| 2017/0038247 A1* | 2/2017 | Zusman ................. G01H 11/08 |
| 2017/0131170 A1* | 5/2017 | Nakamura .............. G01L 23/10 |

FOREIGN PATENT DOCUMENTS

| | | | | |
|---|---|---|---|---|
| JP | S61-245065 A | | 10/1986 | |
| JP | S62-167432 A | | 7/1987 | |
| JP | H03-295431 A | | 12/1991 | |
| JP | 11237403 A | * | 8/1999 | ............. G01P 21/00 |
| JP | 2004-258019 A | | 9/2004 | |
| JP | 2005-172518 A | | 6/2005 | |
| JP | 2006-266738 A | | 10/2006 | |
| JP | 2007-536531 A | | 12/2007 | |

OTHER PUBLICATIONS

Written Opinion of the International Searching Authority issued in International Patent Application No. PCT/JP2015/081279, dated Jan. 19, 2016.

* cited by examiner

SENSOR MODULE

CROSS REFERENCE TO RELATED APPLICATIONS

The present application is a continuation of PCT/JP2015/081279 filed Nov. 6, 2015, which claims priority to Japanese Patent Application No. 2014-246931, filed Dec. 5, 2014, the entire contents of each of which are incorporated herein by reference.

TECHNICAL FIELD

The present disclosure relates to a sensor module that detects a predetermined physical quantity by converting the predetermined physical quantity into electric charge and voltage.

BACKGROUND

A sensor module widely used in practice these days is configured to detect a predetermined physical quantity by using, for example, a piezoelectric element.

Patent Document 1 (identified below) discloses a sensor detection circuit including a piezoelectric element, a charge amplifier, and an amplification circuit. The piezoelectric element includes an output end connected with the charge amplifier. The charge amplifier converts the amount of electric charge detected by the piezoelectric element into a voltage signal, and outputs the voltage signal to the amplification circuit. The amplification circuit amplifies and outputs the voltage signal.

Patent Document 2 (identified below) discloses a physical quantity sensor including a first-stage amplification circuit, a second-stage amplification circuit, and a multiplexor MPX. The first-stage amplification circuit has an output end connected with the multiplexor MPX and the second-stage amplification circuit. The second-stage amplification circuit has an output end connected with the multiplexor MPX. The multiplexor MPX alternately outputs, in a time-divisional manner, an output signal from the first-stage amplification circuit and an output signal from the second-stage amplification circuit.

Patent Document 1: Japanese Patent Laid-open No. 2005-172518.

Patent Document 2: Japanese Patent Laid-open No. 2004-258019.

However, in the sensor detection circuit disclosed in Patent Document 1, the waveform of an output voltage becomes distorted when a too high voltage is input to the amplification circuit while the amplification factor of the amplification circuit is set for amplification of a weak voltage. However, when the input voltage is weak while the amplification factor of the amplification circuit is set to avoid distortion of the waveform of the output voltage, the voltage cannot be amplified to have an amplitude enough to allow detection at a detection unit at a later stage in some cases. In other words, in the sensor detection circuit according to Patent Document 1, a dynamic range for a sensor element is not insufficient.

In the physical quantity sensor disclosed in Patent Document 2, since voltages having different amplification factors are output in a time-divisional manner, an output voltage amplified by an appropriate amplification factor cannot be obtained at appropriate timing.

SUMMARY

Thus, in view of the technical limitations of existing designs, the present disclosure provides a sensor module that includes a detection circuit capable of appropriately amplifying an output voltage of a sensor element without being affected by the amplitude of the output voltage.

A sensor module is disclosed that includes a piezoelectric element configured to generate electric charge in an amount in accordance with a pressing force, a charge amplifier configured to convert the amount of electric charge into a voltage, a calculation unit configured to detect the pressing force based on the voltage output from the charge amplifier, and first and second paths connecting the charge amplifier and the calculation unit and having different amplification factors. According to the exemplary aspect, the amplification factor of the first path is higher than the amplification factor of the second path. The calculation unit detects the pressing force based on a first voltage output through the first path when having detected that the first voltage is lower than a threshold voltage. The calculation unit detects the pressing force based on a second voltage output through the second path when having detected that the first voltage is equal to or higher than the threshold voltage.

With this configuration, the pressing force can be detected based on a voltage amplified by an appropriate amplification factor.

In the sensor module disclosed herein, it is preferable that the calculation unit corrects a voltage used to detect the pressing force based on a ratio of the amplification factor of the first path and the amplification factor of the second path.

With this configuration, reduction can be achieved in a difference between pressing forces detected through the first path and the second path.

According to an exemplary aspect, the first path includes a first amplification circuit and a first capacitor connected with an input stage of the first amplification circuit. Moreover, the second path includes a second amplification circuit having an amplification factor lower than the amplification factor of the first amplification circuit and a second capacitor connected with an input stage of the second amplification circuit. The capacitance of the first capacitor and the capacitance of the second capacitor are equal to each other.

With this configuration, a direct current component is removed through the first capacitor and the second capacitor, thereby preventing amplification of an input offset voltage through the first amplification circuit and the second amplification circuit. Thus, reduction can be achieved in a difference in influence of the input offset between the first amplification circuit and the second amplification circuit. Accordingly, reduction can be achieved in an output voltage difference due to the input offset voltage between the first path and the second path.

According to an exemplary aspect, the sensor module includes a first resistance connected in series with the first capacitor and determining the amplification factor of the first amplification circuit, and a second resistance connected in series with the second capacitor and determining the amplification factor of the second amplification circuit. The impedance of the first resistance and the impedance of the second resistance are equal to each other.

With this configuration, transient change of a ratio of the amplification factors of the first and second amplification circuits can be prevented. Accordingly, reduction can be achieved in errors in the voltage output through the first path and the voltage output through the second path due to the configurations and settings of the amplification circuits.

According to one exemplary aspect, the calculation unit detects a third voltage obtained through the first path and a fourth voltage obtained through the second path when no pressing force is applied on the piezoelectric element. The calculation unit corrects the first voltage by using the third voltage when detecting the pressing force based on the first voltage. The calculation unit corrects the second voltage by using the fourth voltage when detecting the pressing force based on the second voltage.

With this configuration, a voltage used to detect the pressing force can be corrected by using an offset voltage when no pressing force is applied. Accordingly, the pressing force can be more accurately detected.

The sensor module disclosed herein enables appropriate amplification of an output voltage of a sensor element without being affected by the amplitude width of the output voltage. Accordingly, a physical quantity such as a pressing force detected by the sensor element can be accurately detected.

DETAILED DESCRIPTION

Figure 1:
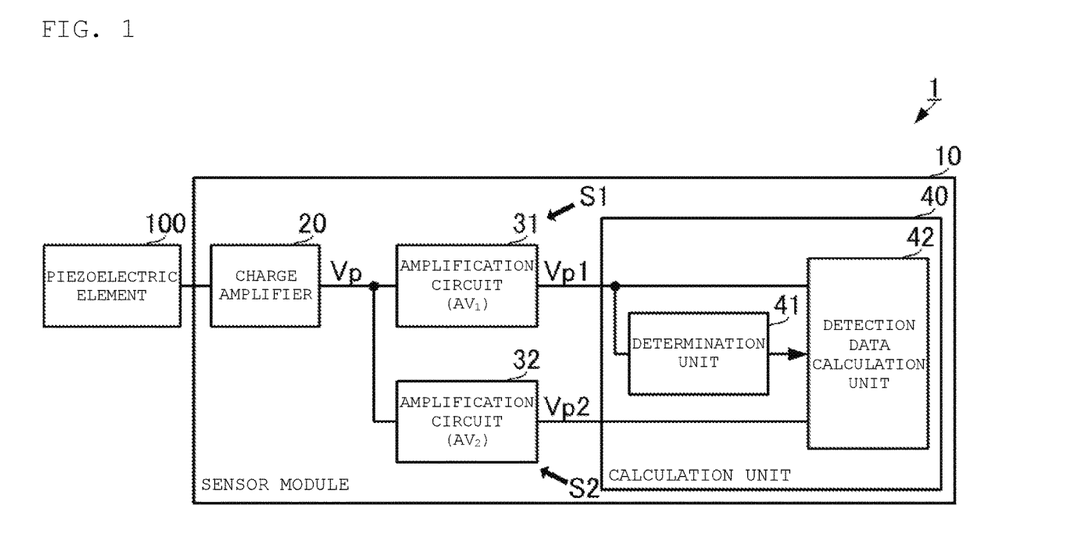
FIG. 1 is a block diagram of the configuration of a sensor module according to a first exemplary embodiment.

The following describes a sensor module according to a first embodiment with reference to the accompanying drawings. FIG. 1 is a block diagram of the configuration of the sensor module according to the first exemplary embodiment. The present embodiment exemplarily describes a sensor module configured to detect a pressing force (by a user/operator, for example) by converting the pressing force into a voltage, but the present disclosure is applicable to a sensor module configured to detect any other physical quantity by converting the physical quantity into a voltage. In particular, the disclosed sensor module effectively detects change in the amount of electric charge by converting the change into a voltage when the amount of electric charge changes with change in a physical quantity.

This sensor module 1 includes a piezoelectric element 100 and a detection circuit 10. The piezoelectric element 100 is connected with the detection circuit 10. The piezoelectric element 100 generates electric charge in an amount in accordance with a pressing force. The detection circuit 10 converts the amount of electric charge generated by the piezoelectric element 100 into a voltage, and detects the pressing force based on this voltage.

The piezoelectric element 100 includes, for example, a piezoelectric film and detection conductors formed on the piezoelectric film. Preferably, the piezoelectric film is a rectangular flat film including first and second principal surfaces facing to each other. The detection conductors are disposed on the first and second principal surfaces of the piezoelectric film.

According to the exemplary aspect, the piezoelectric film is formed of uniaxially extended poly-L-lactic acid (PLLA). PLLA is a chiral polymer and has a helical main chain. PLLA becomes piezoelectric when molecules are oriented by, for example, uniaxial extension. The uniaxially extended PLLA has an extremely high piezoelectric constant as a polymer. An extension ratio of three to eight approximately is preferable. Thermal processing after the extension facilitates crystallization of extended chain crystal of poly lactic acid, thereby achieving an improved piezoelectric constant. In biaxial extension, an effect similar to uniaxial extension can be obtained when different extension ratios are applied for axes.

PLLA becomes piezoelectric through molecule orientation processing by, for example, extension, and no polling processing needs to be performed unlike another polymer such as PVDF or piezoelectric ceramics. Specifically, the piezoelectricity of PLLA, which is not ferroelectric, is not developed through ion polarization unlike ferroelectrics such as PVDF and PZT, but is intrinsic to a helical structure as a characteristic molecule structure. Thus, PLLA has no pyroelectricity developed in any other ferroelectric piezoelectric body. In addition, for example, PVDF has a piezoelectric constant that varies with time or significantly decreases in some cases, but PLLA has a piezoelectric constant that is extremely stable with time.

PLLA has an extremely low relative permittivity of 2.5 approximately, and thus has a large piezoelectric output constant (piezoelectric g constant; $g=d/\varepsilon^T$ where d represents a piezoelectric constant and $\varepsilon^T$ represents a dielectric constant).

The piezoelectric g constant of PVDF having a dielectric constant $\varepsilon_{33}^T$ of $13\times\varepsilon_0$ and a piezoelectric constant $d_{31}$ of 25 pC/N is calculated to be $g_{31}=0.2172$ Vm/N by the above-described formula. Through conversion into $g_{31}$, the piezoelectric g constant of PLLA having a piezoelectric constant $d_{14}$ of 10 pC/N is calculated to be $g_{31}=0.2258$ Vm/N because $d_{14}=2\times d_{31}$ and thus $d_{31}=5$ pC/N. Thus, PLLA having a piezoelectric constant $d_{14}$ of 10 pC/N can sufficiently have a pressing amount detection sensitivity equivalent to that of PVDF. Accordingly, the pressing force can be detected at a further extremely high sensitivity by using PLLA experimentally obtained by the inventors of the present invention and having $d_{14}$ of 15 to 20 pC/N.

Each detection conductor is preferably any one of an organic electrode made of ITO, ZnO, or polythiophene as a primary component, an organic electrode made of polyaniline as a primary component, and a silver nano wire electrode. The use of these materials allows formation of a highly translucent electrode. When no translucency electrode is required, an electrode made of silver paste or a metallic electrode formed by evaporation coating, sputtering, or plating may be used.

In the exemplary aspect, pressing on a flat surface (principal surface) of the piezoelectric element 100 thus formed generates electric charge in the piezoelectric film. The electric charge can be detected by an external circuit through the detection conductors.

The detection circuit 10 includes a charge amplifier 20, a first path S1 including an amplification circuit 31, a second path S2 including an amplification circuit 32, and a calculation unit 40.

Figure 2:
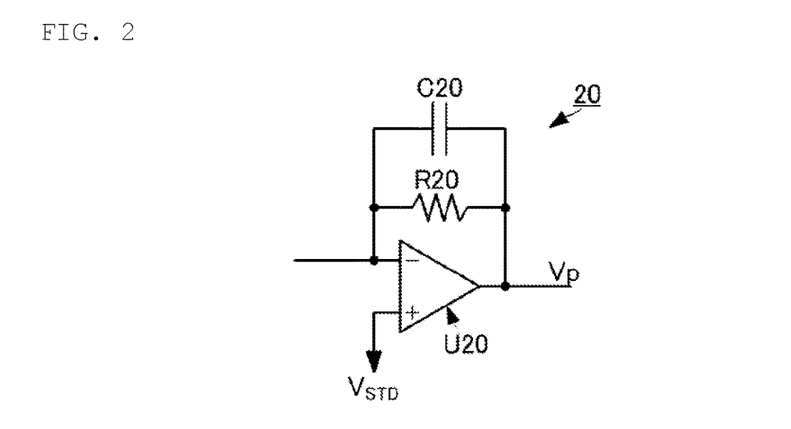
FIG. 2 is a circuit diagram of a charge amplifier of the sensor module according to the first exemplary embodiment.

FIG. 2 is a circuit diagram of the charge amplifier of the sensor module according to the first exemplary embodiment. The charge amplifier 20 includes an operational amplifier U20, a resistance R20, and a capacitor C20. The operational amplifier U20 includes an inverting input terminal connected with one of the detection conductors of the piezoelectric element 100. The other detection conductor of the piezoelectric element 100 is connected with a constant potential such as ground potential or piezoelectric-element reference potential. The operational amplifier U20 includes a non-inverting input terminal connected with an operational-amplifier reference potential $V_{STD}$. The operational amplifier U20 includes an output terminal connected (feedback connected) with the inverting input terminal of the operational amplifier U20 through a parallel circuit of the resistance R20 and the capacitor C20. With this configuration, the impedance of the operational amplifier U20 with respect to the piezoelectric element 100 is sufficiently smaller than the impedance of a feedback circuit including the resistance R20 and the capacitor C20.

In such a configuration, the charge amplifier 20 converts the amount of electric charge generated by the piezoelectric element 100 into a voltage Vp. The voltage Vp output from the charge amplifier 20 can be obtained through equations below. In the following equations, C represents the capacitance of the capacitor C20, and R represents the pure resistance of the resistance R20. In the following equations, Q represents the amount of electric charge generated by the piezoelectric element 100. In the following equations, f represents the frequency of change in the electric charge amount Q.

$$Vp = Q/C \text{ when } f >> 1/(2\pi CR) \quad (1)$$

$$Vp = R(dQ/dt) \text{ when } f << 1/(2\pi CR) \quad (2)$$

Typically, an operator presses the piezoelectric element 100 at low frequency. Thus, under use condition of the sensor module 1 according to the present embodiment, the output voltage Vp of the charge amplifier 20 is determined based on Equation 2. In other words, the output voltage Vp of the charge amplifier 20 is proportional to the time derivative of the amount of electric charge. The pressing force is linearly related with the amount of electric charge.

Thus, detection of pressing force requires continuous acquisition of temporal change of the output voltage. As indicated in Equation 2, the output voltage Vp of the charge amplifier 20 is proportional to the speed of change of the amount of electric charge, and thus the output voltage Vp depends on the pressing operation of an operator and needs a wider dynamic range.

When the capacitance of the capacitor C20 and the pure resistance of the resistance R20 are increased, the pressing force can be detected based on Equation 1, but a circuit operation becomes slow and takes a longer time to reach stabilization after activation. For this reason, it is preferable for detection sensitivity and output stability of the sensor module 1 to use the charge amplifier 20 within a range in which the output voltage Vp can be obtained through Equation 2.

The output voltage Vp of the charge amplifier 20 is output to the first path S1 and the second path S2.

Figure 3:
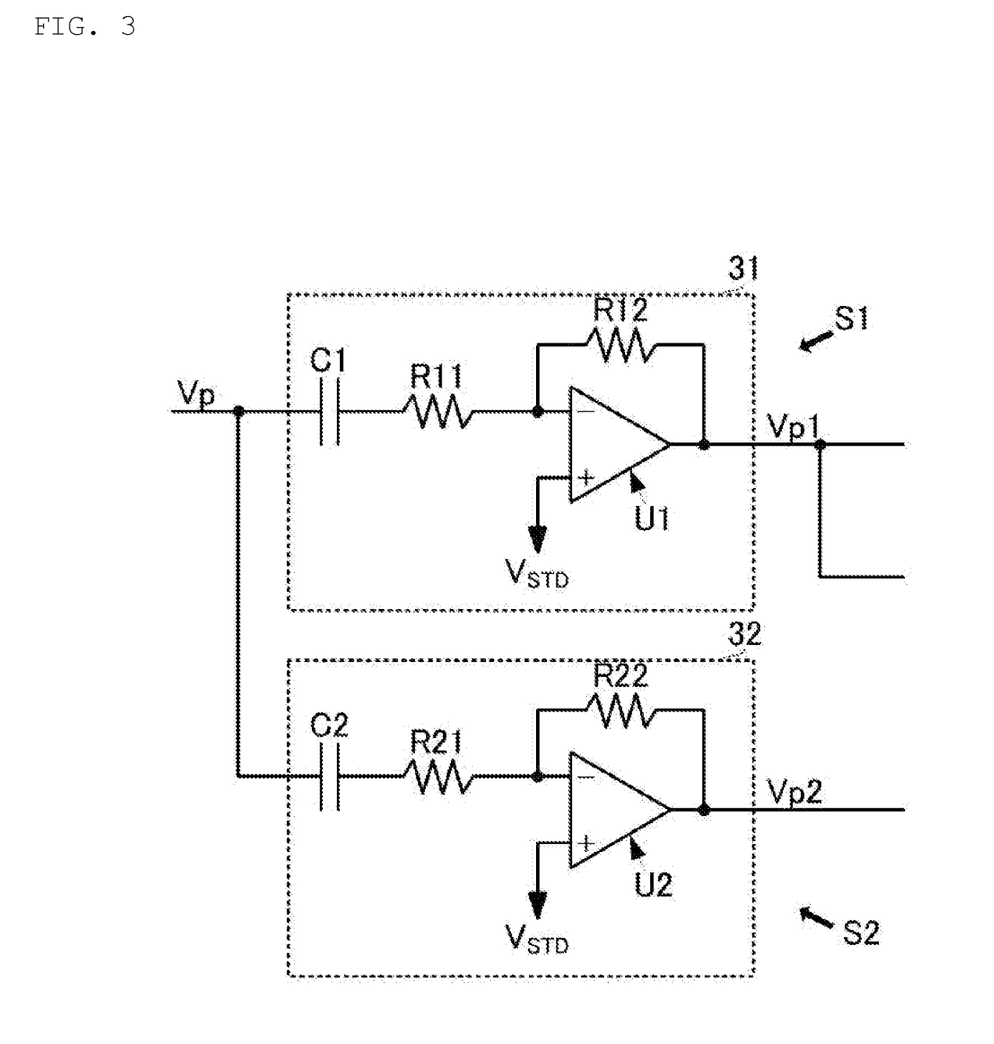
FIG. 3 is a circuit diagram of a first path and a second path of the sensor module according to the first exemplary embodiment.

FIG. 3 is a circuit diagram of the first and second paths of the sensor module according to the first exemplary embodiment.

The first path S1 includes the amplification circuit 31. The second path S2 includes the amplification circuit 32. The amplification circuits 31 and 32 each have an input end connected with an output terminal of the charge amplifier 20.

According to the exemplary aspect, the amplification circuit 31 includes an operational amplifier U1, resistances R11 and R12 (i.e., resistors), and a capacitor C1. The operational amplifier U1 includes an inverting input terminal connected with a series circuit of the resistance R11 (corresponding to a "first resistance" as described herein) and the capacitor C1 (corresponding to a "first capacitor" as described herein). The capacitor C1 includes a terminal connected with the resistance R11 and the other terminal connected with the output terminal of the charge amplifier 20. The operational amplifier U1 includes a non-inverting input terminal connected with the operational-amplifier reference potential $V_{STD}$. The operational amplifier U1 includes an output terminal connected with the inverting input terminal of the operational amplifier U1 through the resistance R12. The ratio R12/R11 between the pure resistance of the resistance R11 and the pure resistance of the resistance R12 determines an amplification factor $AV_1$.

The amplification circuit 32 includes an operational amplifier U2, resistances R21 and R22 (i.e., resistors), and a capacitor C2. The operational amplifier U2 includes an inverting input terminal connected with a series circuit of the resistance R21 (corresponding to a "second resistance" as described herein) and the capacitor C2 (corresponding to a "second capacitor" as described herein). The capacitor C2 includes a terminal connected with the resistance R21 and the other terminal connected with the output terminal of the charge amplifier 20. The operational amplifier U2 includes a non-inverting input terminal connected with the operational-amplifier reference potential $V_{STD}$. The operational amplifier U2 includes an output terminal connected with the inverting input terminal of the operational amplifier U2 through the resistance R22. The ratio R22/R21 between the pure resistance of the resistance R21 and the pure resistance of the resistance R22 determines an amplification factor $AV_2$.

The amplification factor $AV_1$ of the amplification circuit 31 is higher than the amplification factor $AV_2$ of the amplification circuit ($AV_1 > AV_2$). The amplification circuit 31 amplifies the output voltage Vp of the charge amplifier 20 by the amplification factor $AV_1$, and outputs an output voltage Vp1 (corresponding to a "first voltage" as described herein) to the calculation unit 40. The amplification circuit 32 amplifies the output voltage Vp of the charge amplifier 20 by the amplification factor $AV_2$, and outputs an output voltage Vp2 (corresponding to a "second voltage" as described herein) to the calculation unit 40. Accordingly, the calculation unit 40 receives the output voltages Vp1 and Vp2 obtained by amplifying the output voltage Vp of the charge amplifier 20 by the different amplification factors $AV_1$ and $AV_2$. The amplification factors $AV_1$ and $AV_2$ preferably differ from each other by order of magnitude.

The calculation unit 40 includes a determination unit 41 and a detection data calculation unit 42. The calculation unit 40 is, for example, a microcomputer and includes A/D conversion circuits at ends connected with the first and second paths S1 and S2. The A/D conversion circuits convert analog signals of the output voltages Vp1 and Vp2 into digital data. The A/D conversion circuit are not essential, but the pressing force calculation may be performed by using the analog signals of the output voltages Vp1 and Vp2. When the microcomputer is employed, the configuration of the calculation unit 40 can be simplified. For simplicity of description, the following describes processing and operation of the calculation unit 40 using analog signals.

The determination unit 41 stores, in advance, a threshold VTH for processing switching. The determination unit 41 compares the output voltage Vp1 and the threshold VTH and outputs a result of the comparison to the detection data calculation unit 42. For example, the determination unit 41 is a comparator configured to output "Hi" data to the detection data calculation unit 42 if the output voltage Vp1 is lower than the threshold VTH, or output "Low" data to the detection data calculation unit 42 if the output voltage Vp1 is equal to or higher than the threshold VTH.

The detection data calculation unit 42 calculates detection data of the pressing force by multiplying the output voltages Vp1 and Vp2. The detection data calculation unit 42 selects any one of the output voltage Vp1 and the output voltage Vp2 based on an output from the determination unit 41. Specifically, when having detected that "Hi" data has been received from the determination unit 41, the detection data calculation unit 42 calculates detection data of the pressing force by using the output voltage Vp1. When having detected that "Low" data has been received from the determination unit 41, the detection data calculation unit 42 calculates detection data of a pressing amount by using the output voltage Vp2.

Figure 4:
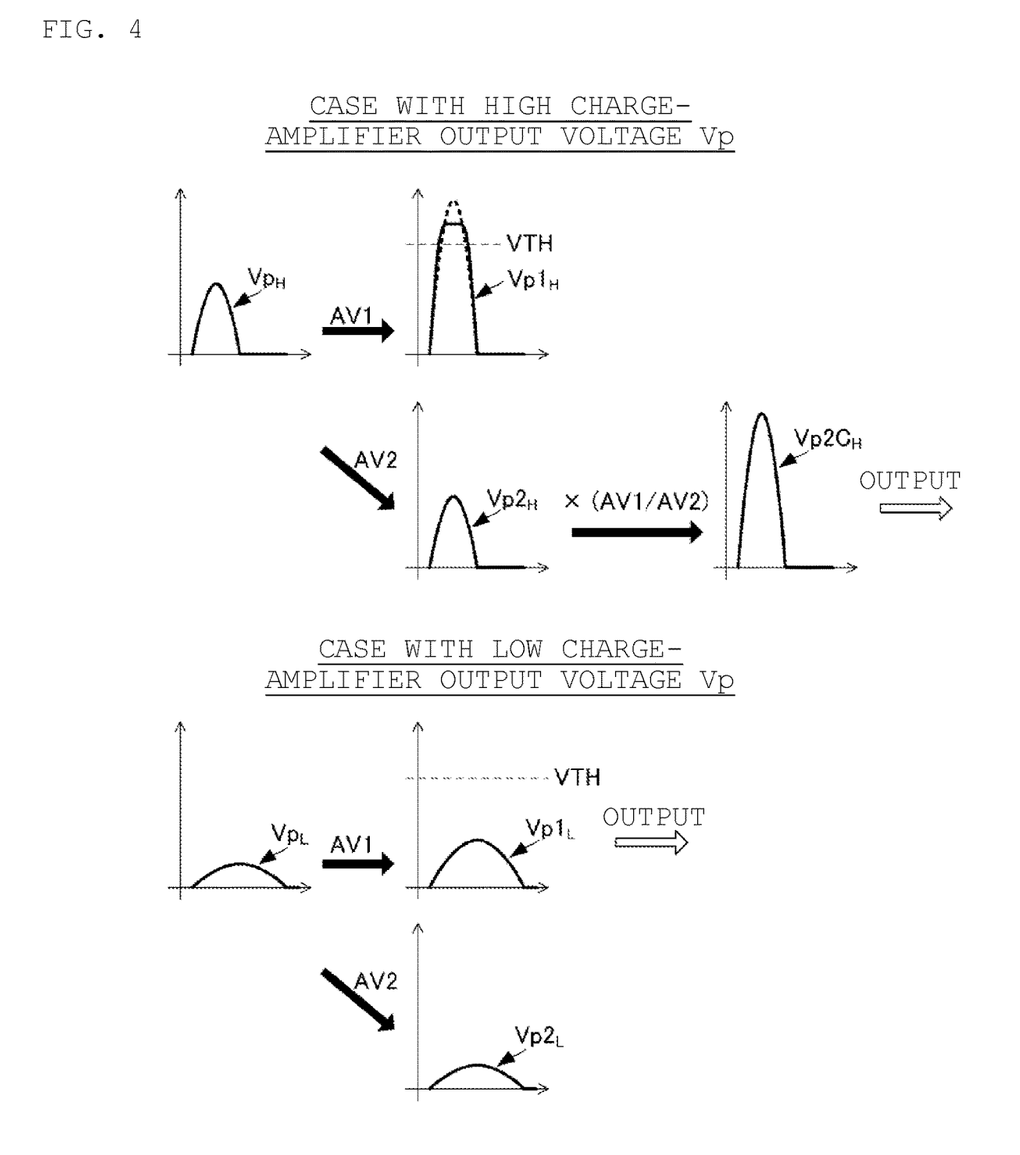
FIG. 4 is a diagram illustrating the processing at the sensor module according to the first exemplary embodiment.

FIG. 4 is a diagram illustrating the processing at the sensor module according to the first exemplary embodiment.

As described above, the amplification factor $AV_1$ of the amplification circuit 31 is higher than the amplification factor $AV_2$ of the amplification circuit 32. Accordingly, the amplitude of the output voltage Vp1 is larger than the amplitude of the output voltage Vp2.

As illustrated in FIG. 4, when the output voltage Vp of the charge amplifier 20 is high, the amplification circuit 31 operates in a saturated range beyond a linear range and has an output voltage $Vp1_H$, the waveform of which is distorted. When the output voltage Vp of the charge amplifier 20 is high, the amplification circuit 32, the amplification factor $AV_2$ of which is low, operates out of a saturated range and has an output voltage $Vp2_H$, the waveform of which is not distorted. For this reason, when the output voltage Vp of the charge amplifier 20 is high, the output voltage $Vp2_H$ of the amplification circuit 32 is used in place of the output voltage $Vp1_H$ of the amplification circuit 31.

When the output voltage Vp of the charge amplifier 20 is low, the amplification circuit 31 operates out of the saturated range beyond the linear range, and has an output voltage $Vp1_L$, the waveform of which is not distorted. The amplification circuit 32, the amplification factor $AV_2$ of which is low, operates out of the saturated range similarly to the amplification circuit 31, and has an output voltage $Vp2_L$, the waveform of which is not distorted. In this case, any of the output voltages $Vp1_L$ and $Vp2_L$ can be used, but the resolution of digital sampling can be improved when the output voltage $Vp1_L$ is used because the amplitude of the output voltage $Vp1_L$ is larger than the amplitude of the output voltage $Vp2_L$. In other words, the pressing force can be accurately detected. For this reason, when the output voltage Vp of the charge amplifier 20 is low, the output voltage $Vp1_L$ of the amplification circuit 31 is used in place of the output voltage $Vp2_L$ of the amplification circuit 31.

To allow this selection between the output voltages, the threshold VTH is set based on a voltage at which the amplification circuit 31 starts operating in the saturated range. Specifically, the threshold VTH is set to a voltage with a predetermined voltage margin, which is lower than the voltage at which the amplification circuit 31 starts operating in the saturated range.

Since the amplification factor $AV_1$ of the amplification circuit 31 and the amplification factor $AV_2$ of the amplification circuit 32 are different from each other, the above-described configuration obtains different amplification factors depending on whether the output voltage Vp of the charge amplifier 20 is high or low. In other words, the output voltage $Vp2_H$ when the output voltage Vp of the charge amplifier 20 is high, and the output voltage $Vp2_L$ when the output voltage Vp of the charge amplifier 20 is low have different amplification factors. In this manner, depending on the magnitude of the output voltage Vp of the charge amplifier 20, different amplification factors are applied to a voltage used to detect the pressing force by the detection data calculation unit 42.

As illustrated in FIG. 4, when the output voltage Vp of the charge amplifier 20 is high and the output voltage Vp2 of the amplification circuit 32 is selected, the detection data calculation unit 42 calculates a corrected output voltage $Vp2C_L$ by multiplying the output voltage $Vp2_L$ by a correction coefficient. The correction coefficient is the ratio $AV_1/AV_2$ between the amplification factor $AV_1$ and the amplification factor $AV_2$.

Such correction processing allows detection of the pressing force to be performed by using output voltages $Vp1_L$ and $Vp2C_H$ amplified by an identical amplification factor, when an amplification circuit, the amplification factor of which differs depending on whether the output voltage Vp of the charge amplifier 20 is high or low, is used. Accordingly, the pressing force having a large dynamic range can be accurately detected.

As described above, the configuration and processing of the present embodiment enable an output voltage in accordance with the pressing force to be amplified without waveform distortion irrespective of the size and speed of the pressing force. Thus, the pressing force can be detected at high resolution irrespective of the size and speed of the pressing force. In addition, the configuration and processing of the present embodiment enable the output voltages Vp1 and Vp2 having different amplification factors to be continuously acquired for detecting the pressing force. Accordingly, the pressing force can be accurately detected at appropriate timing.

The above description is made on an example with saturation of the amplification circuits 31 and 32 taken into account, but the above-described configuration and processing are applicable to a case with the processing allowable range of the A/D conversion circuit taken into account.

In the above description, the amplification circuits 31 and 32 are connected with the capacitors C1 and C2, respectively. When a direct-current offset voltage is superimposed on an input voltage, the operational amplifiers U1 and U2 amplify the offset voltage as well, which causes output error. However, when connected with the input ends of the operational amplifiers U1 and U2, the capacitors C1 and C2 can remove the offset voltage input to the operational amplifiers U1 and U2.

Thus, the amplification circuits 31 and 32 according to the present embodiment, which are connected with the capacitors C1 and C2, enable more accurate detection of the pressing force. The capacitors C1 and C2 can be omitted when the input offset voltage is substantially zero.

Figure 5:
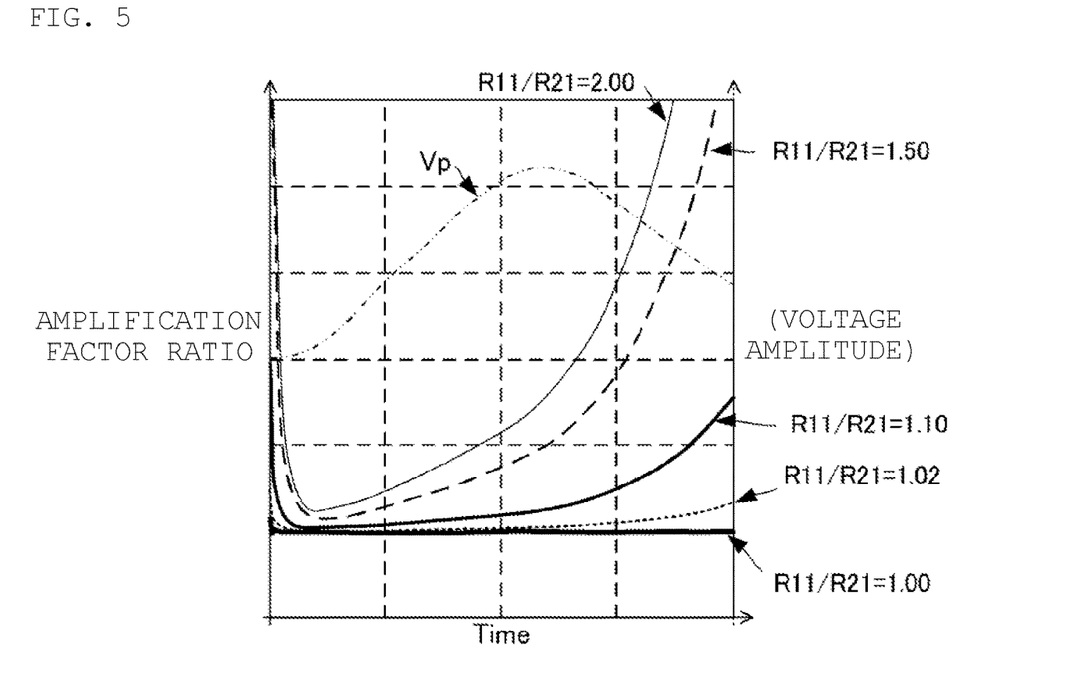
FIG. 5 is a graph illustrating a ratio of resistances connected with input ends and a ratio of the amplification factors of operational amplifiers.

In the detection circuit 10 according to the present embodiment, the pure resistance of the resistance R11, which is connected with the input end of the operational amplifier U1 of the amplification circuit 31, is equal to the pure resistance of the resistance R21, which is connected with the input end of the operational amplifier U2 of the amplification circuit 32. FIG. 5 is a graph illustrating a ratio of the resistances connected with the input ends and a ratio of the amplification factors of the operational amplifiers. As a precondition of FIG. 5, a resistance ratio of the resistance R11 and the resistance R12 connected with the operational amplifier U1 is equal to a resistance ratio of the resistance R21 and the resistance R22 connected with the operational amplifier U2. In other words, in designing, the amplification factor $AV_1$ of the operational amplifier U1 and the amplification factor $AV_2$ of the operational amplifier U2 are equal to each other, and the ratio of the amplification factors is constant independently of time.

However, as illustrated in FIG. 5, when the pure resistance of the resistance R11 and the pure resistance of the resistance R21 are different from each other, the ratio of the amplification factors changes with time. In FIG. 5, a dashed and double-dotted line represents the output voltage Vp of the charge amplifier 20. As illustrated in FIG. 5, the ratio of the amplification factors changes while the output voltage Vp of the charge amplifier 20 is changed by the pressing force, in other words, detection of the pressing force is transient.

When the pure resistance of the resistance R11 and the pure resistance of the resistance R21 are equal to each other, however, the ratio of the amplification factors is constant independently of time.

Thus, in the detection circuit 10 according to the present embodiment, in which the pure resistance of the resistance R11 and the pure resistance of the resistance R21 are equal to each other, the ratio of the amplification factors does not change with time, and thus the pressing force can be accurately detected whenever any of the output voltages Vp1 and Vp2 is selected at any timing.

Figure 6:
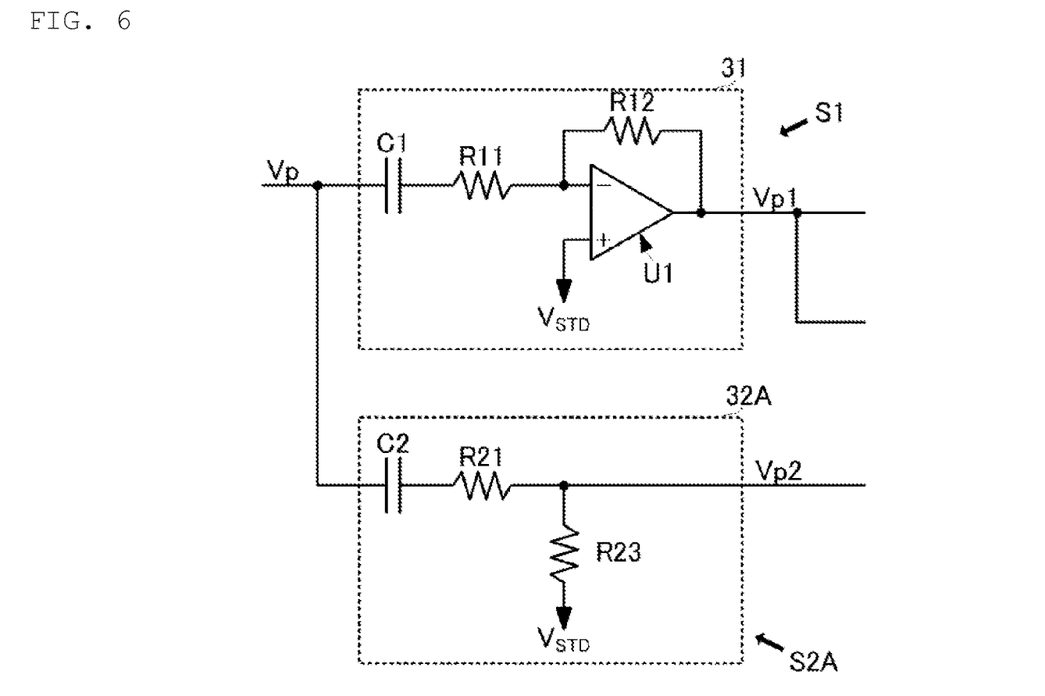
FIG. 6 is a circuit diagram of an amplification circuit part (path) of a sensor module according to a second exemplary embodiment.

The following describes a sensor module according to a second exemplary embodiment with reference to the accompanying drawings. FIG. 6 is a circuit diagram of an amplification circuit part (path) of the sensor module according to the second exemplary embodiment. The sensor module according to the present embodiment differs from the sensor module 1 according to the first embodiment in the configuration of a second path S2A. The other configuration of the sensor module according to the present embodiment is same as that of the sensor module 1 according to the first embodiment.

The second path S2A includes a voltage transmission circuit 32A. The voltage transmission circuit 32A includes a resistance R21, a resistance R23, and a capacitor C2. The capacitor C2 and the resistance R21 are connected in series with each other, and this series circuit is disposed between and connected with the charge amplifier 20 and the calculation unit 40. In the series circuit, the capacitor C2 is connected with the charge amplifier 20, and the resistance R21 is connected with the calculation unit 40.

The resistance R21 is connected with a reference potential $V_{STD}$ through the resistance R23 at an end part closer to the calculation unit 40.

With such a configuration, when the detection data calculation unit 42 as an output destination of the second path S2A has an input impedance sufficiently larger than that of the resistance R23, the second path S2A can have a circuit configuration electrically equivalent to a circuit configuration in which an amplification circuit having an amplification factor of R23/(R21+R23) is connected. When the resistance R23 is sufficiently larger than the resistance R21, this amplification factor can be regarded as one. In addition, the second path S2A is provided with no operational amplifier in the configuration according to the present embodiment, which leads to a simplified circuit.

Figure 7:
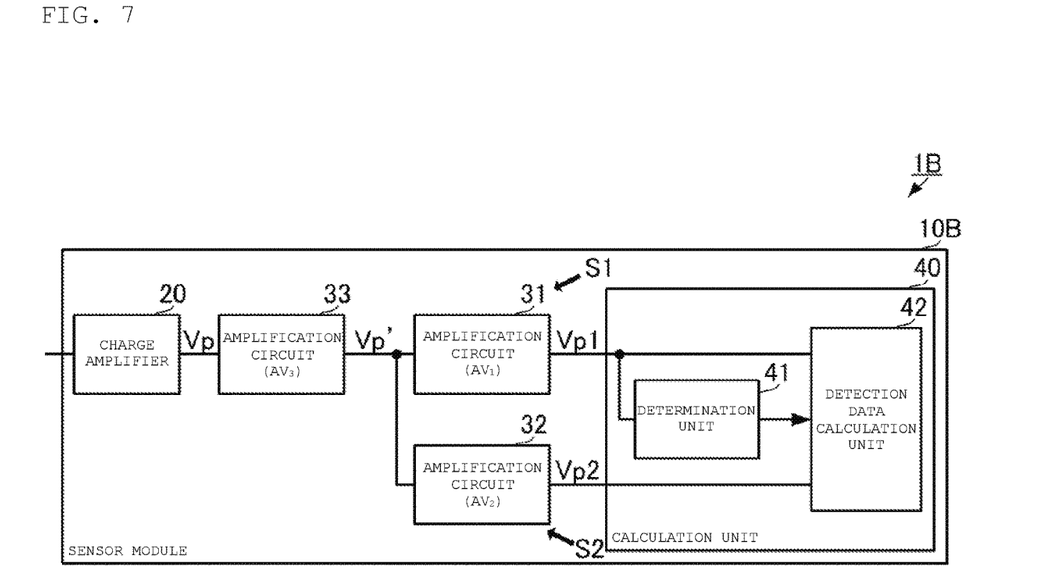
FIG. 7 is a block diagram of a detection circuit of a sensor module according to a third exemplary embodiment.

The following describes a sensor module according to a third exemplary embodiment with reference to the accompanying drawings. FIG. 7 is a block diagram of a detection circuit of the sensor module according to the third exemplary embodiment. This sensor module 1B according to the present embodiment includes an amplification circuit 33 in addition to the sensor module 1 according to the first embodiment. The other configuration of the sensor module 1B is same as that of the sensor module 1 according to the first embodiment.

The amplification circuit 33 is included in a detection circuit 10B. The amplification circuit 33 is connected with an output end of the charge amplifier 20. The amplification circuit 33 amplifies the output voltage Vp of the charge amplifier 20 by an amplification factor AV3, and outputs an output voltage Vp' to the amplification circuits 31 and 32.

With such a configuration, when the output voltage Vp of the charge amplifier 20 is weak, the voltage can be amplified to have a sufficient amplitude for use in detection of the pressing force, and can be input to the detection data calculation unit 42. In such a case, although voltage through the amplification circuit 31 having a large amplification factor is potentially likely to be distorted due to saturation, the use of the above-described configuration and processing can achieve accurate detection of the pressing force without using the distorted voltage. This allows detection of the pressing force in a wider dynamic range.

DESCRIPTION OF REFERENCE SYMBOLS 1, 1B: sensor module
10, 10B: detection circuit
20: charge amplifier
31, 32, 33: amplification circuit
32A: voltage transmission circuit
40: calculation unit
41: determination unit
42: detection data calculation unit
100: piezoelectric element
C1, C2, C20: capacitor
R11, R12, R20, R21, R22, R23: resistance
S1: first path
S2, S2A: second path
U1, U2, U20: operational amplifier

The invention claimed is:

1. A sensor module comprising:
a piezoelectric element configured to generate electric charge in response to a pressing force;
a charge amplifier coupled to the piezoelectric element and configured to convert the electric charge into a voltage;
a calculation unit configured to detect the pressing force based on the voltage output from the charge amplifier;
wherein the calculation unit is connected to an output of the charge amplifier to receive the converted voltage by a first path and a second path having different amplification factors from each other and being connected in parallel between the charge amplifier and the calculation unit,
wherein the calculation unit detects the pressing force based on a first voltage received from the first path when the first voltage is lower than a threshold voltage, and
wherein the calculation unit detects the pressing force based on a second voltage received from the second path when the first voltage is equal to or higher than the threshold voltage.

2. The sensor module according to claim 1, wherein the amplification factor of the first path is higher than the amplification factor of the second path.

3. The sensor module according to claim 2, wherein the calculation unit is further configured to correct the voltage of either the first or second voltage used to detect the pressing force based on a ratio of the amplification factor of the first path and the amplification factor of the second path.

4. The sensor module according to claim 1, wherein the first path includes a first amplification circuit and a first capacitor connected to an input stage of the first amplification circuit.

5. The sensor module according to claim 4, wherein the second path includes a second amplification circuit having an amplification factor lower than the amplification factor of the first amplification circuit and a second capacitor connected to an input stage of the second amplification circuit.

6. The sensor module according to claim 5, wherein the capacitance of the first capacitor and the capacitance of the second capacitor are equal to each other.

7. The sensor module according to claim 5, further comprising:
a first resistor connected in series with the first capacitor and determining the amplification factor of the first amplification circuit; and
a second resistor connected in series with the second capacitor and determining the amplification factor of the second amplification circuit.

8. The sensor module according to claim 5, further comprising:
a first resistor connected in series with the first capacitor; and
a second resistor connected between an inverting input and an output of the first amplification circuit,
wherein the amplification factor of the first amplification circuit is based on a ratio of a resistance of the second resistor to a resistance of the first resistor.

9. The sensor module according to claim 8, further comprising:
a third resistor connected in series with the second capacitor; and
a fourth resistor connected between an inverting input and an output of the second amplification circuit,
wherein the amplification factor of the second amplification circuit is based on a ratio of a resistance of the fourth resistor to a resistance of the third resistor.

10. The sensor module according to claim 7, wherein an impedance of the first resistor and an impedance of the second resistor are equal to each other.

11. The sensor module according to claim 1, wherein the calculation unit is further configured to:
detect a third voltage received from the first path and a fourth voltage received from the second path when no pressing force is applied on the piezoelectric element,
correct the first voltage using the third voltage when detecting the pressing force based on the first voltage, and
correct the second voltage using the fourth voltage when detecting the pressing force based on the second voltage.

12. The sensor module according to claim 1, wherein the calculation unit further comprises:
a comparator connected to the first path and configured to compare the first voltage with the threshold voltage; and
a microcomputer configured detect the pressing force based on either the first voltage or the second voltage depending on the output of the comparator.

13. The sensor module according to claim 12, wherein the threshold voltage is a voltage with a predetermined voltage margin that is lower than a voltage at which an amplification circuit in the first path becomes saturated.

14. The sensor module according to claim 1, wherein the charge amplifier comprises an operational amplifier having an inverting input coupled to an output of the piezoelectric element and a non-inverting input coupled to a constant potential.

15. The sensor module according to claim 14, wherein the charge amplifier further comprises a resistor coupled between the inverting input and an output of the operation amplifier and a capacitor coupled in parallel to the resistor.

16. A sensor comprising:
a piezoelectric element that generates electric charge in response to a pressing force;
a charge amplifier that converts the electric charge into a voltage that is proportional to the pressing force;
a first amplification circuit in a first path coupled to an output of the charge amplifier;
a second amplification circuit in a second path coupled to the output of the charge amplifier, wherein the second amplification circuit has a different amplification factor than the first amplification circuit and is connected in parallel with the first amplification circuit between the charge amplifier and the calculation unit;
a determination unit configured to compare a first voltage output from the first amplification circuit to a threshold voltage; and
a calculation unit coupled to each of the output of the first amplification circuit, an output of the second amplification circuit, and an output of the determination unit, the calculation unit being configured to:
detect the pressing force based on the first voltage output from the first amplification unit when the determination unit determines that first voltage is lower than a threshold voltage, and
detect the pressing force based on a second voltage output from the second amplification unit when the determination unit determines that the first voltage is equal to or higher than the threshold voltage.

17. The sensor according to claim 16, wherein the calculation unit is further configured to correct a voltage used to detect the pressing force based on a ratio of the amplification factor of the first amplification circuit and the amplification factor of the second amplification circuit.

18. The sensor according to claim 16, further comprising:
a first capacitor connected to an input stage of the first amplification circuit; and
a second capacitor connected to an input stage of the second amplification circuit,
wherein the capacitance of the first capacitor and the capacitance of the second capacitor are equal to each other.

19. The sensor according to claim 16, wherein the calculation unit is further configured to:
detect, when no pressing force is applied on the piezoelectric element, a third voltage from a first path of the first amplification circuit and a fourth voltage from a second path of the second amplification circuit,
correct the first voltage using the third voltage when detecting the pressing force based on the first voltage, and
correct the second voltage using the fourth voltage when detecting the pressing force based on the second voltage.

20. The sensor according to claim 16, wherein the threshold voltage is a voltage with a predetermined voltage margin that is lower than a voltage at which an the first amplification circuit becomes saturated.

* * * * *